United States Patent [19]

Suzuki

[11] Patent Number: 5,470,240
[45] Date of Patent: Nov. 28, 1995

[54] CARD EDGE CONNECTOR COMPRISING LEVERS FOR A CARD BOARD ON BOTH ENDS OF AN INSULATOR ROD

[75] Inventor: Keiichiro Suzuki, Tokyo, Japan

[73] Assignee: Japan Aviation Electronics Industry, Limited, Japan

[21] Appl. No.: 179,163

[22] Filed: Jan. 10, 1994

[30] Foreign Application Priority Data

May 27, 1993 [JP] Japan ................. 5-028045 U

[51] Int. Cl.⁶ ................................. H01R 13/00
[52] U.S. Cl. ................. 439/157; 439/153; 439/160
[58] Field of Search ................. 439/157, 153, 439/160

[56] References Cited

U.S. PATENT DOCUMENTS

| | | | |
|---|---|---|---|
| 4,241,966 | 12/1980 | Gomez | 439/157 |
| 5,074,800 | 12/1991 | Sasao et al. | 439/157 |
| 5,163,847 | 11/1992 | Regnier | 439/157 |
| 5,302,133 | 4/1994 | Tondreault | 439/157 |

*Primary Examiner*—P. Austin Bradley
*Assistant Examiner*—Jeffrey T. Knapp
*Attorney, Agent, or Firm*—Laff, Whitesel, Conte & Saret, Ltd.

[57] ABSTRACT

For receiving a card board, each card edge connector comprises: (A) an insulator rod comprising conductive contacts for connection to connecting pads of the card board with an indent formed along a top edge thereof and (B) first and second levers pivoted on respective ends of the rod. Supported by the first lever, the card board is urged to the insulator rod until its bottom edge fits the indent. At the same time, the second lever is inwardly turned to fit a corresponding side edge of the card board. On detaching the card board, the second lever is supposed to be outwardly pulled by a user. Being pried by a wrench arm of the second lever, the card board is turned upwardly so that the card board is put out of a mechanical contact with the rod.

9 Claims, 3 Drawing Sheets

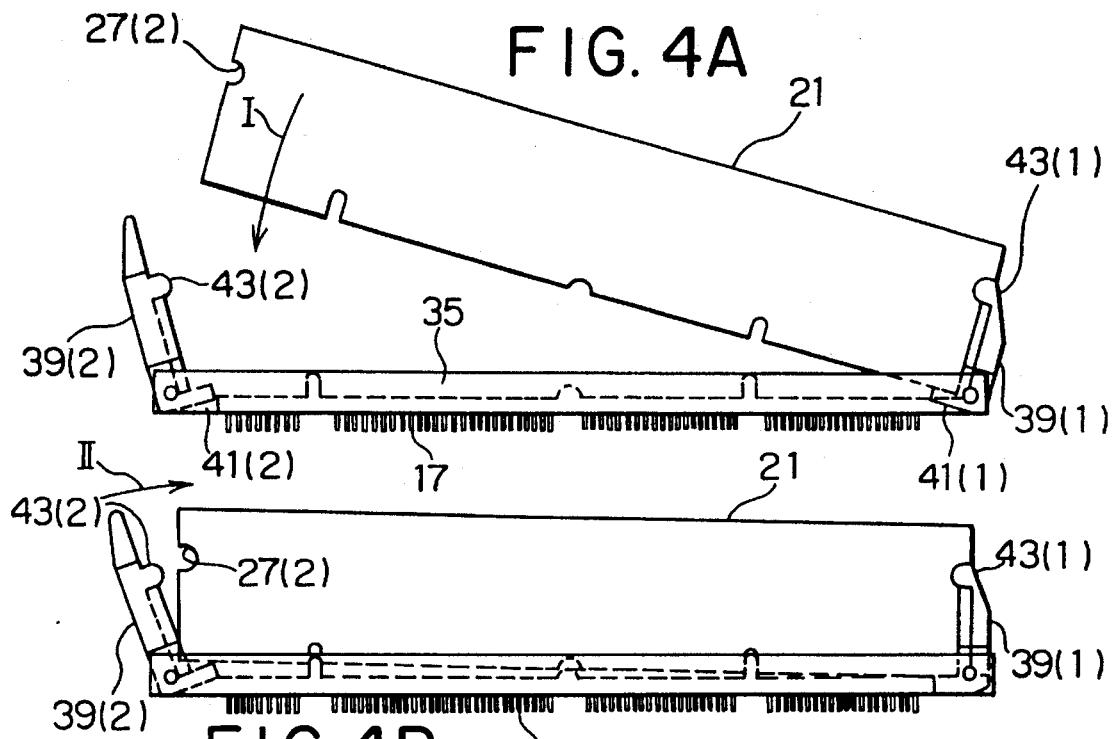
FIG. 4A
FIG. 4B
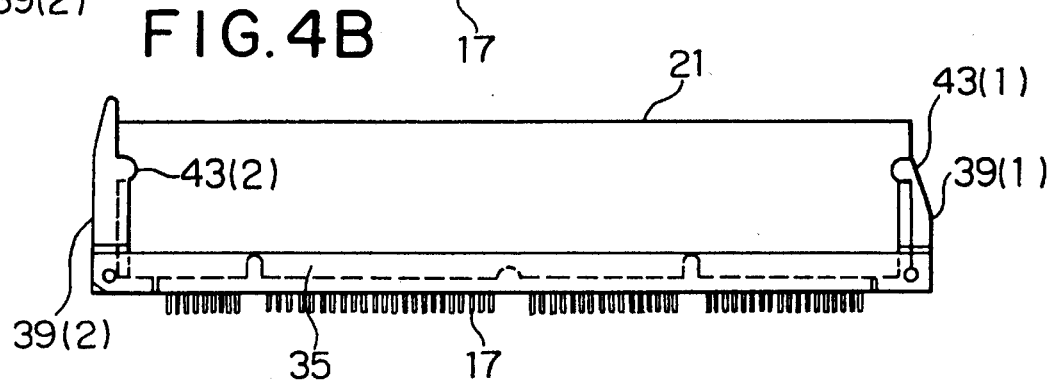
FIG. 4C
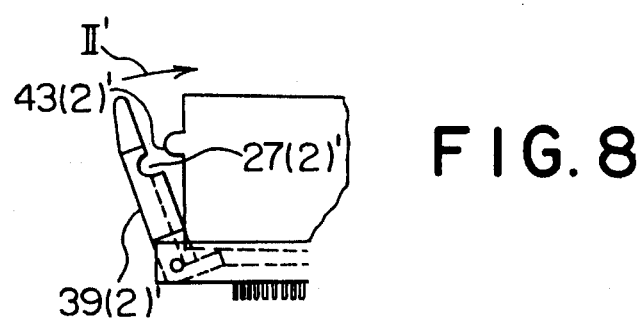
FIG. 8

5,470,240

CARD EDGE CONNECTOR COMPRISING LEVERS FOR A CARD BOARD ON BOTH ENDS OF AN INSULATOR ROD

BACKGROUND OF THE INVENTION

This invention relates to a card edge connector for a card board which is typically a printed circuit board.

In the manner which will later be described more in detail, a conventional card edge connector is applicable to a card board having a row of conductive connecting pads extended from its bottom edge. The card edge connector includes an insulator rod with an indent formed along its top surface and with a plurality of conductive contacts extended from a bottom edge of the insulator rod in one-to-one correspondence to the connecting pads. The conductive contacts are for establishing electric connection to the connecting pads when the bottom edge of the card board is fitted in the indent to put the card board in mechanical contact with the insulator rod. A use of the card edge connector can put the connecting pads into and out of electric contact with the conductive contacts.

It should, however, be noted that the conductive contacts are enormous in number, amounting to, for example, one hundred and several tens in number. This results in a disadvantage such that the user must strongly push and pull the card board on putting the bottom edge of the card board into and out of fit with the indent to bring the connecting pads into and out of electric contact with the connecting contacts.

SUMMARY OF THE INVENTION

It is consequently a principal object of this invention to provide a card edge connector with which it is possible to easily attach and detach the card board thereto and therefrom.

It is a subordinate object of this invention to provide a card edge connector which is of the type described and in which easy attachment and detachment of the card board is further facilitated.

It is another subordinate object of this invention to provide a card edge connector which is of the type described in which easy attachment of the card board is assisted by a spring member.

It is still another object of this invention to provide a card edge connector which is of the type described and which can be mounted on a supporting device with a raised density of mounting in lengthwise combination with another card edge connector of the type described.

Other objects of this invention will become clear as the description proceeds.

According to this invention, there is provided a card edge connector for use in combination with a card board having a row of conductive connecting pads parallel to its card bottom edge, the card edge connector including an insulator rod with an indent formed along its top surface and with a plurality of conductive contacts extended from a rod bottom edge of the insulator rod in one-to-one correspondence for electric connection to the connecting pads when the card bottom edge of the card board is fitted in the indent to put the card board in mechanical contact with the insulator rod, wherein the insulator rod comprises first and second levers pivoted at both ends thereof for prying the card board into and out of the mechanical contact.

BRIEF DESCRIPTION OF THE DRAWING

FIGS. 4(A) through (C) are side views of the card edge connector and the card board depicted in FIG. 2 for use in describing their cooperation;

FIG. 8 is a fragment of FIG. 4(B) showing that the positions of a projection and a recess may be reversed.

DESCRIPTION OF THE PREFERRED EMBODIMENTS

Figure 1:
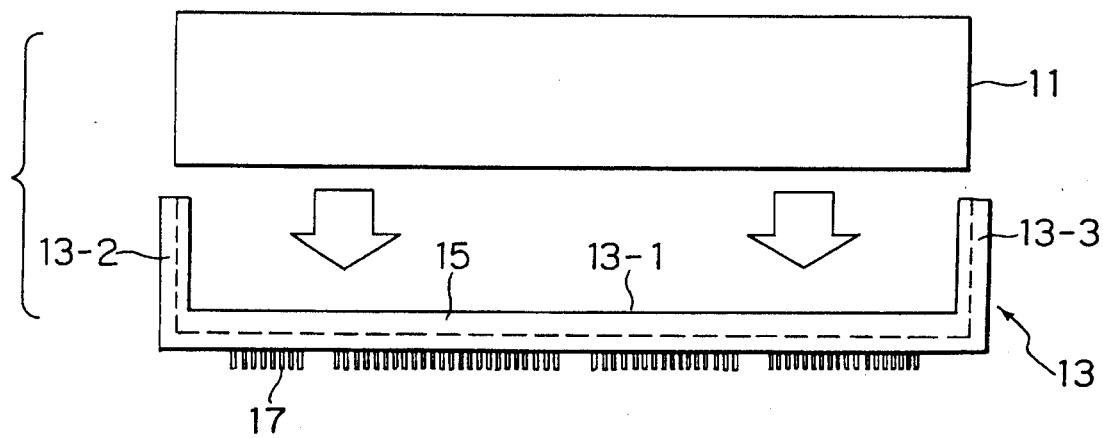
FIG. 1 is a side view of a conventional card edge connector and a card board.

Referring to FIG. 1, a conventional card edge connector will first be described in order to facilitate an understanding of this invention. The card edge connector is structured in the manner which will presently be described. The card edge connector is for a card board 11 which is typically a printed circuit board. The card board 11 has rectangular front and back faces, bottom and top edges and first and second side edges. Furthermore, the card board 11 has a plurality of connecting pads (later illustrated) running to the bottom edge on one or both of the front and the back faces.

The conventional card edge connector comprises a connector body which is named an insulator rod 13. The insulator rod 13 comprises a rod body 13-1 and upright left and right portions 13-2 and 13-3. The insulator rod 13 is formed with a lengthy indent 15 for receiving the bottom, the first and the second side edges of the card board 11. Extended from a bottom edge of the insulator rod 13 in one-to-one correspondence to the connecting pads, a plurality of conductive contacts 17 are for establishing electric connection to the connecting pads when the bottom edge of the card board 11 is fitted in the indent 15 to put the card board 11 in mechanical contact with the insulator rod 13.

The indent 15 is formed on a top edge of the insulator body 13-1 and inward side of the left and the right side portions 13-2 and 13-3 so that the bottom edge and the first and the second side edges of the card board 11 are snugly inserted to the indent 15 when the card board 11 is pushed downwardly of the figure as shown by arrows. In this way, the card board 11 is attached to the card edge connector 31 with each of the conductive contacts 17 connected to the corresponding one of the connecting pads.

The conductive contacts 17 are enormous in number, amounting to one hundred and several tens in number. Because of snug insertion and the enormous number, a disadvantage results such that a user must strongly push and pull the card board 11 on putting the bottom edge and the side edges of the card board 11 into and out of fit with the indent 15 to bring into and out of electric contact of the connecting pads with the conductive contacts 17.

Referring to FIGS. 2 through 5, the description will proceed to a card edge connector according to a first embodiment of this invention. Throughout the following, similar parts are designated by like reference numerals.

Like the conventional card edge connector illustrated with reference to FIG. 1, the card edge connector of FIGS. 2 through 5 is for a card board which is again typically a printed circuit board and will be described with a new reference numeral 21 used therefor. The card board 21 is substantially rectangular in shape and has top and bottom card edges and left and right card side edges. First through third bottom recesses 23(1), 23(2), and 23(3) are preferably reversed from the bottom card edge. A row of connecting pads 25 are formed along the bottom card edges in the manner depicted. First and second side recesses 27(1) and 27(2) are formed along the right and the left card side edges.

Figure 3:
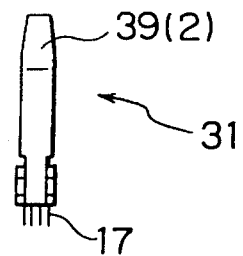
FIG. 3 is a left end view of the card edge connector illustrated in FIG. 2.

Indicated by a fresh reference numeral 31, the card edge connector comprises an insulator rod 33 which has a rectangular cross-section in outline, first and back surfaces, top and bottom rod edges, and left and right ends. As best shown in FIG. 3, the insulator rod 33 has thin front and back extensions at each of the left and the right ends. A void is interposed between the first and the back extensions and opens upwards, downwards, and sidewards. An indent 35 is formed along the top rod edge between the left and the right ends. First through third upwardly directed to knots 37(1), 37(2), and 37(3) are preferably formed in the indent 35. The above-mentioned conductive contacts are depicted at 17 and are extended downwardly from the bottom rod edge. In the manner which will presently be described, the indent 35 snugly receives the bottom card edge with the knots 37 (suffixes omitted) received in the bottom recesses 23 (suffixes omitted) and the conductive contacts 17 brought into electric connection with the connecting pads 25. In this manner, the card board 21 is put into and out of mechanical contact with the card edge connector 31.

In the card edge connector 31, first and second levers 39(1) and 39(2) are pivoted in the voids at the right and the left ends by short axles to the front and the back extensions. The levers 39 (suffixes omitted) have inwardly directed or inward edges and bottom ends. First and second wrench areas 41(1) and 41(2) are sideway extended from the first and the second levers 39 at their bottom ends. When the bottom card edge is received in the indent 35, the wrench arms 41 (suffixes omitted) are in loose fit with the indent 35 below the bottom card edge.

The first and the second levers 39 are for prying in cooperation the card board 21 to put the card board 21 into and out of mechanical contact with the card edge connector 31 and to bring the connecting pads 25 into and out of the electric connection with the conductive contacts 17. More particularly, the first and the second levers 39 are provided with first and second side projections 43(1) and 43(2) at their inward edges. The first and the second side projections 43 (suffixes omitted) are situated so as to fit in the side recesses 27 (suffixes omitted) when the card board 21 is put in place.

As will readily be understood, it is possible to provide the side projections 43 on the side card edges and the side recesses 27 on the inward edges. In other words, each of the levers 39 may be provided with one of the side projection 43 and the side recess 27 with the other of the side projection 43 and the side recess 27 formed on the side card edge.

Alternatively, it is possible to provide none of the side recesses 27 on the side card edge. In this event, the side projections 43 of the levers 39 are used to make the side card edges.

Figure 2:
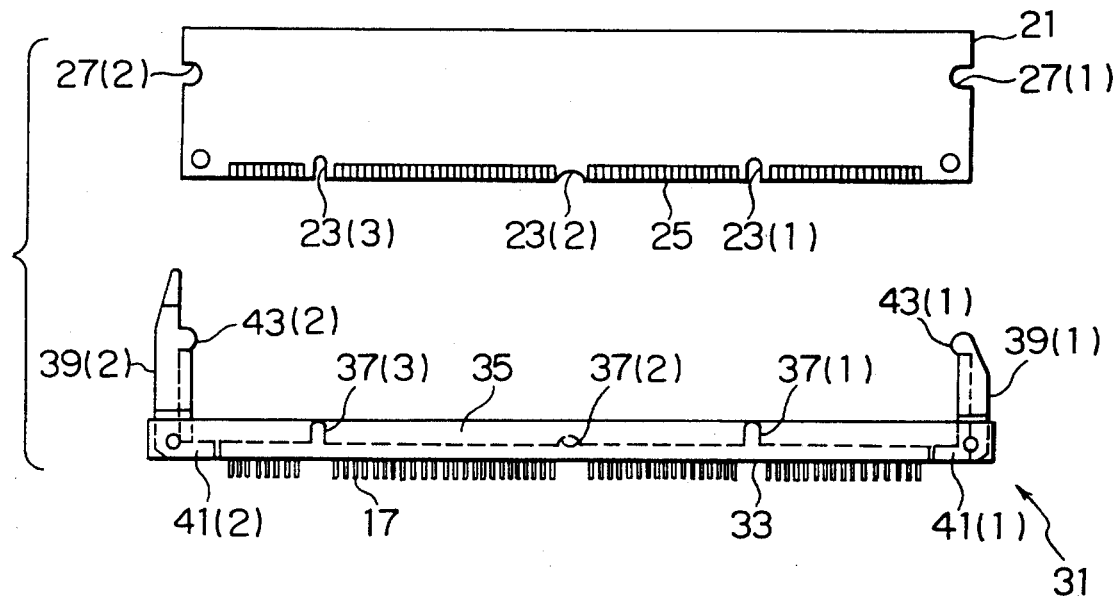
FIG. 2 shows a side view of a card edge connector according to a first embodiment of this invention and a side view of a card board.

FIGS. 4(A) through (C) and FIG. 8 will more particularly be referred to. In FIG. 4(A), the first lever 39(1) is used first to support the card board 21 at its one of the side card edges by cooperation of the side projection 43(1) with the side recess 27(1) (FIG. 2). For this purpose, the first lever 39(1) may be provided with an extension of the indent 35 along its inward edge for tight fit with the side card edge as depicted in FIG. 2. Incidentally, the second lever 39(2) may similarly be provided with another extension of the indent 35 in loose fit with the other of the side card edges in the manner depicted in FIG. 2 and FIGS. 4(A) through (C).

FIG. 8 shows that the location of projection 43 and recess 27 may be reversed as shown at 43(2)' and 27(2)'. Otherwise, FIG. 8 is the same as part of FIG. 4(B). In the meanwhile, the second lever 39(2) is outwardly rotated. The first lever 39(1) is inwardly pushed manually or otherwise to rotate the card board 21 as indicated by a counterclockwise arrow I. Incidentally, the connecting pads 25 are not depicted merely for simplicity of illustration.

In FIG. 4(B), the card board 21 is brought into mechanical contact with the card edge connector 31. The second lever 39(2) is manually or otherwise inwardly rotated as indicated by a clockwise arrow II.

In FIG. 4(C), the card board 21 is put in place. The side projection 43(2) is snugly received in the side recess 27(2) (FIG. 4(B)). Electric connection is established between the connecting pads 25 (FIG. 2) and the conductive contacts 17.

Figure 5:
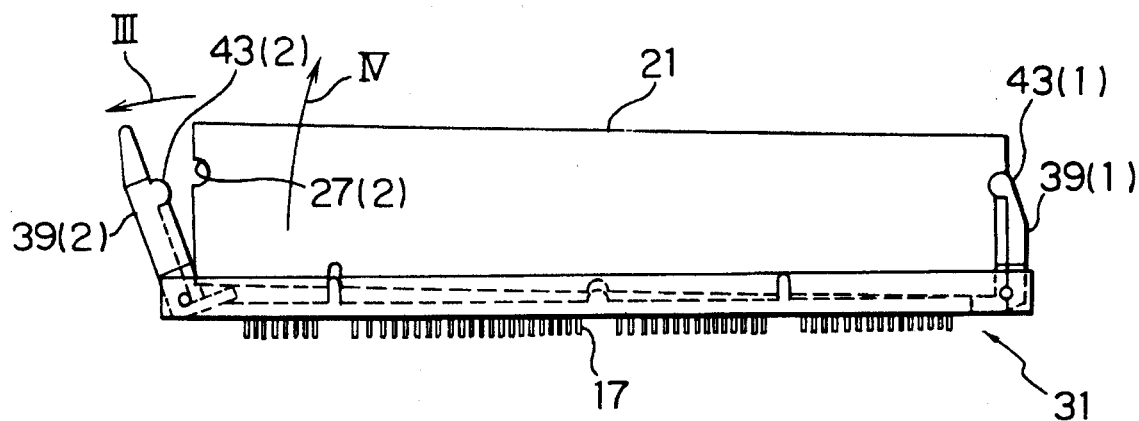
FIG. 5 is a side view of the card edge connector and the card board shown in FIG. 2 for use in describing a detaching operation.

Referring more specifically to FIG. 5, the card board 21 is brought out of mechanical contact with the card edge connector 31 and out of fit to the first lever 39(1) if desired, by reversedly carrying out the above-described processes. It is now appreciated that the card board 21 is readily put into and out of mechanical attachment to the card edge connector 31.

On disassembling the card board 21 from the card edge connector 31, all a user has to do is to pull the second lever 39(2) outwardly as indicated by a counterclockwise arrow III. Being turned on the short axle at the left end of the insulator rod 33 in accordance with the counterclockwise arrow III, the wrench arm 41 serves to pry the card board 21 as indicated by a clockwise arrow IV. The second lever 39(2) is pulled apart to be disengaged from the second side edge of the card board 21. Together with the card board 21, the first lever 39(1) is rotated on the short axle at the right end of the insulator rod 33. It is now readily possible to pull the card board 21 away from the first lever 39(1). The card board 21 is brought out of the mechanical connection.

Figure 6:
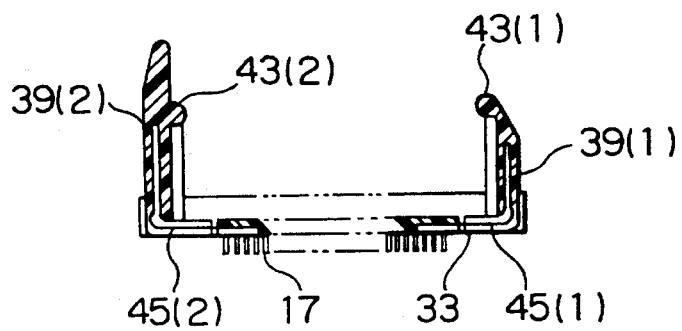
FIG. 6 is a vertical sectional view of a card edge connector according to a second embodiment of this invention.

Referring afresh to FIG. 6, the description will next proceed to a card edge connector according to a second embodiment of this invention. Each of the first and the second levers 39(1) and 39(2) is formed with a lengthwise insertion hole. The first lever 39(1) has a shorter lever length than side edges of the card board 21 (FIG. 2). It should be noted that the card board 21 has a top card edge. When put in place, the second lever 39(2) protrudes over the top card edge.

First and second "L"-shaped leaf spring members 45(1) and 45(2) have perpendicular bodies and horizontal legs. Each of the perpendicular bodies is inserted into the insertion hole. The horizontal legs are put in right and left bottoms of the indent 35 so as to be in one-to-one correspondence below right and left bottom corners of the card board 21. The first and the second leaf spring members 45 (suffixes omitted) interlink the insulator rod 33 and the first and the second levers 39, urging the first and the second levers 39 inwardly to the side edges of the card board 21 when the card board 21 is put in the mechanical contact with the insulator rod 33.

Figure 7A:
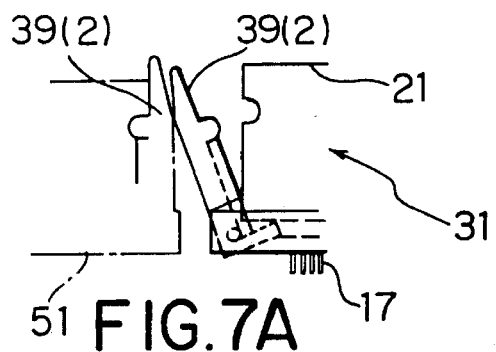
FIGS. 7(A) and (B) are side views partly illustrative of a plurality of card edge connectors and a card board of the type illustrated in FIG. 2.

Referring afresh to FIG. 7(A), first and second card edge connectors are arranged in a lengthwise coplanar combination on a supporting device (not shown). The first card edge connector is designated by a reference number 31 and is depicted by a solid line. The second card edge connector is denoted by another reference number 51 and is depicted by a dash-dot line. Each of the first and the second card edge connectors 31 and 51 has a structure described in conjunction with FIGS. 2 through 5. The card boards for the card edge connectors are indicated in common at 21 and are of the type described before.

It should be noted that the second levers 39(2) of the first and the second card edge connectors 31 and 51 are disposed adjacent to each other. This is convenient to arrange the card edge connectors 31 and 51 so as to put the card boards 21 in place as shown in FIG. 4(C). On disassembling the card board 21 from the first card edge connector 31 in the manner illustrated with reference to FIG. 5, it is necessary to provide an appreciable space between the second levers 39(2). This is inconvenient for increasing of a density of mounting.

Figure 7B:
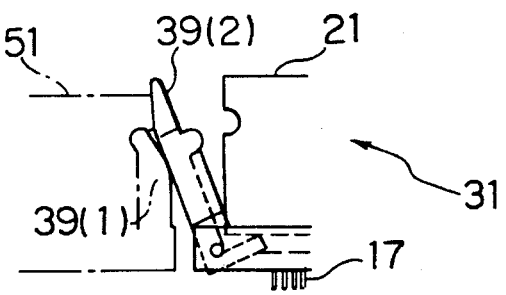

Turning to FIG. 7(B), the appreciable space is appreciably reduced. In this example, the second lever 39(2) of the first card edge connector 31 is disposed adjacent to the first lever 39(1) of the second card edge connector 51. It should be noted that a space can be made smaller than that shown in FIG. 7(A). More particularly, the second lever 39(2) of the first card edge connector 51 can be turned like in FIG. 7(A), because the first lever 39(1) of the second edge connector 51 is given the first lever length shorter than the side length of the card board 21. As a result, the density of mounting a plurality of card edge connectors, such as 31 and 51, is large in FIG. 7(B) than in FIG. 7(A).

While this invention has thus far been described in specific conjunction with two preferred embodiments thereof, it will now be readily possible for one skilled in the art to put this invention into effect in various other manners. For example, the first lever 39(1) should preferably be not protruded from the top card edge when the card board 21 is put in place as depicted in FIG. 4. It is, however, possible to make the first lever 39(1) have a substantially same length as the second lever 39(2). In addition, it is possible to understand that a combination of each lever 39 and its wrench arm 41 is a single lever.

What is claimed is:

1. A printed circuit card edge connector for use in combination with a printed circuit card board having a row of conductive connecting pads parallel to its bottom edge, said card edge connector including an insulator rod with an indent formed along its top surface and with a plurality of conductive contacts extending from a rod bottom edge of said insulator rod in a one-to-one correspondence with said connecting pads for making electric connections to said connecting pads when the card bottom edge of said card board is fitted in said indent to put said card board in mechanical contact with said insulator rod,
wherein said insulator rod comprises first and second levers pivoted at respective ends of said insulator rod for locking said card board into and for prying said bottom edge said card board out of said mechanical contact.

2. A card edge connector as claimed in claim 1, wherein each of said levers is provided with a wrench arm at its lever bottom end for fitting in said indent below the card bottom edge of said card board when said card board is put in said mechanical contact.

3. A card edge connector as claimed in claim 2, wherein each of said levers is provided with one of a projection and a recessed part on its inner surface for engaging a side edge of said card board when said card board is put in said mechanical contact.

4. A card edge connector as claimed in claim 3, and a card board, wherein a side edge of said card board is provided with a complement of said one of said projection and said recessed part for fitting said one of the projection and the recessed part when said card board is put in said mechanical contact.

5. A card edge connector and a card board as claimed in claim 4, wherein said first lever is for supporting said card board and brings said complement of the projection and the recessed part of said card board into a fit with said one of the projection and the recessed part of said second lever when said card board is put in said mechanical contact.

6. A printed circuit card edge connector and a printed card board for use in combination with said card edge connector comprising a printed circuit card board having a row of conductive connecting pads parallel to its bottom edge, said card edge connector including an insulator rod with an indent formed along its top surface and with a plurality of conductive contacts extended from a rod bottom edge of said insulator rod in a one-to-one correspondence with said connecting pads for making electric connections to said connecting pads when the card bottom edge of said card board is fitted in said indent in order to put said card board in mechanical contact with said insulator rod;
wherein said insulator rod comprises first and second levers pivoted at opposite ends of said insulator rod for locking said card board into and for prying said card board out of said mechanical contact;
each of said levers having one of a projection and a recessed part on its inner surface for engaging a side edge of said card board when said card board is put in said mechanical contact;
a side edge of said card board having a complement of said one of said projection and said recessed part for fitting said one of the projection and the recessed part when said card board is put in said mechanical contact;
said first lever supporting said card board and bringing said complement of the projection and the recessed part of said card board into a fit with said one of the projection and the recessed part of said second lever when said card board is put in said mechanical contact; and
said card board having a top card edge, said second lever protruding over said top card edge when said card board is put in said mechanical contact.

7. A card edge connector for use in combination with a card board having a row of conductive connecting pads parallel to its card bottom edge, said card edge connector including an insulator rod with an indent formed along its top surface and with a plurality of conductive contacts extended from a rod bottom edge of said insulator rod in a one-to-one correspondence for completing an electric connection to said connecting pads when the card bottom edge of said card board is fitted in said indent to put said card board in mechanical contact with said insulator rod,
wherein said insulator rod comprises first and second levers pivoted at respective ends of said insulating rod for locking said card board into and for prying said card board out of said mechanical contact, and
said insulator rod and one of said levers being interlinked by a spring member for urging said one of the levers inwardly toward a side edge of said card board when said card board is put in said mechanical contact.

8. A card edge connector as claimed in claim 7, wherein each of said levers is provided with one of a projection and a recessed part on its inner surface;

said card board having first and second side edges complementary to said first and said second levers and being provided with the other of said projection and said recessed part on each of said side edges for fitting said one of the projection and the recessed part of said levers when said card board is put in said mechanical contact.

9. A card edge connector as claimed in claim 7, said card board having a top card edge, wherein said second lever is protruded over said top card edge when said card board is put in said mechanical contact.

* * * * *